United States Patent
Ha et al.

(10) Patent No.: US 10,678,036 B2
(45) Date of Patent: Jun. 9, 2020

(54) OPTICAL DEVICE AND LIGHT SOURCE MODULE INCLUDING THE SAME

(71) Applicant: SAMSUNG ELECTRONICS CO., LTD., Suwon-si (KR)

(72) Inventors: Sang Woo Ha, Seongnam-si (KR); Tetsuo Ariyoshi, Suwon-si (KR); Kyung Mi Moon, Suwon-si (KR); Jong Sup Song, Hwaseong-si (KR); Jong Pil Won, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/021,729

(22) Filed: Jun. 28, 2018

(65) Prior Publication Data
US 2019/0155009 A1 May 23, 2019

(30) Foreign Application Priority Data
Nov. 20, 2017 (KR) .................. 10-2017-0155022

(51) Int. Cl.
*F21V 5/04* (2006.01)
*G02B 19/00* (2006.01)
(Continued)

(52) U.S. Cl.
CPC .......... *G02B 19/0071* (2013.01); *F21V 5/007* (2013.01); *F21V 5/04* (2013.01);
(Continued)

(58) Field of Classification Search
CPC . F21V 7/0091; F21V 7/04; F21V 5/04; F21V 7/0066; F21V 13/04; F21V 7/0008;
(Continued)

(56) References Cited

U.S. PATENT DOCUMENTS 6,372,608 B1   4/2002   Shimoda et al.
6,473,554 B1 * 10/2002  Pelka ............... G02B 6/0018
                                                    385/146
(Continued)

FOREIGN PATENT DOCUMENTS

JP         3131252 U     4/2007
KR      10-0639873 B1   10/2006
(Continued)

*Primary Examiner* — Anh T Mai
*Assistant Examiner* — Fatima N Farokhrooz
(74) *Attorney, Agent, or Firm* — Sughrue Mion, PLLC

(57) ABSTRACT

An optical device is provided. The optical device includes a first surface that defines a concave light incident surface facing a central axis and a light source; a second surface disposed opposite the first surface which is configured to reflect light incident on the concave light incident surface; and an inclined light exit surface between the first surface and the second surface. The second surface includes a concave first reflective portion curving toward the first surface, and a substantially flat second reflective portion which portion is interposed between a first reflective portion edge of the first reflective portion and an outer second surface edge of the second surface. The first reflective portion is configured to totally reflect light incident at a predetermined angle or more with respect to a top surface of the light source once to the light exit surface.

20 Claims, 11 Drawing Sheets

(51) Int. Cl.
*F21V 7/00* (2006.01)
*F21V 13/04* (2006.01)
*F21V 5/00* (2018.01)
*H01L 33/62* (2010.01)
*F21Y 115/10* (2016.01)
*F21Y 105/14* (2016.01)
*H01L 33/56* (2010.01)
*H01L 33/60* (2010.01)
*F21Y 105/10* (2016.01)

(52) U.S. Cl.
CPC .......... *F21V 7/0066* (2013.01); *F21V 7/0091* (2013.01); *F21V 13/04* (2013.01); *G02B 19/0028* (2013.01); *G02B 19/0061* (2013.01); *F21Y 2105/10* (2016.08); *F21Y 2105/14* (2016.08); *F21Y 2115/10* (2016.08); *H01L 33/56* (2013.01); *H01L 33/60* (2013.01); *H01L 33/62* (2013.01)

(58) Field of Classification Search
CPC ............ G02B 19/0028; G02B 19/0061; G02B 17/086; G02B 19/008; F21Y 2105/14; F21Y 2115/10; F21Y 2101/00; H01L 33/54; H01L 33/52; H01L 33/56; H01L 33/58; H01L 33/60; H01L 2224/48091; H01L 2224/48095; H01L 2924/181; F25D 27/00; F21K 9/60
See application file for complete search history.

(56) References Cited

U.S. PATENT DOCUMENTS

| | | | |
|---|---|---|---|
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2009/0091944 A1* | 4/2009 | de Lamberterie | G02B 6/0045 362/516 |
| 2010/0195315 A1* | 8/2010 | Ohkawa | G02B 6/0016 362/97.1 |
| 2011/0205642 A1 | 8/2011 | Na et al. | |
| 2011/0249214 A1 | 10/2011 | Cheong et al. | |
| 2014/0061699 A1* | 3/2014 | Kim | G02B 17/086 257/98 |
| 2014/0160733 A1* | 6/2014 | Ono | F21K 9/60 362/97.1 |
| 2014/0168970 A1 | 6/2014 | Choi et al. | |
| 2014/0307433 A1* | 10/2014 | Kim | F21V 7/04 362/327 |
| 2015/0378214 A1* | 12/2015 | Tran | G02B 17/00 349/64 |

FOREIGN PATENT DOCUMENTS

| | | |
|---|---|---|
| KR | 10-2011-0096796 A | 8/2011 |
| KR | 10-2014-0123134 A | 10/2014 |
| KR | 10-2014-0131792 A | 11/2014 |
| KR | 10-1467638 B1 | 12/2014 |
| KR | 10-2015-0041692 A | 4/2015 |
| KR | 10-1699058 B1 | 2/2017 |

* cited by examiner

II − II'

θ = 5°

θ = 10°

θ = 20°

θ = 25°

θ = 30°

θ = 5°

θ = 10°

θ = 20°

θ = 30°

θ = 35°

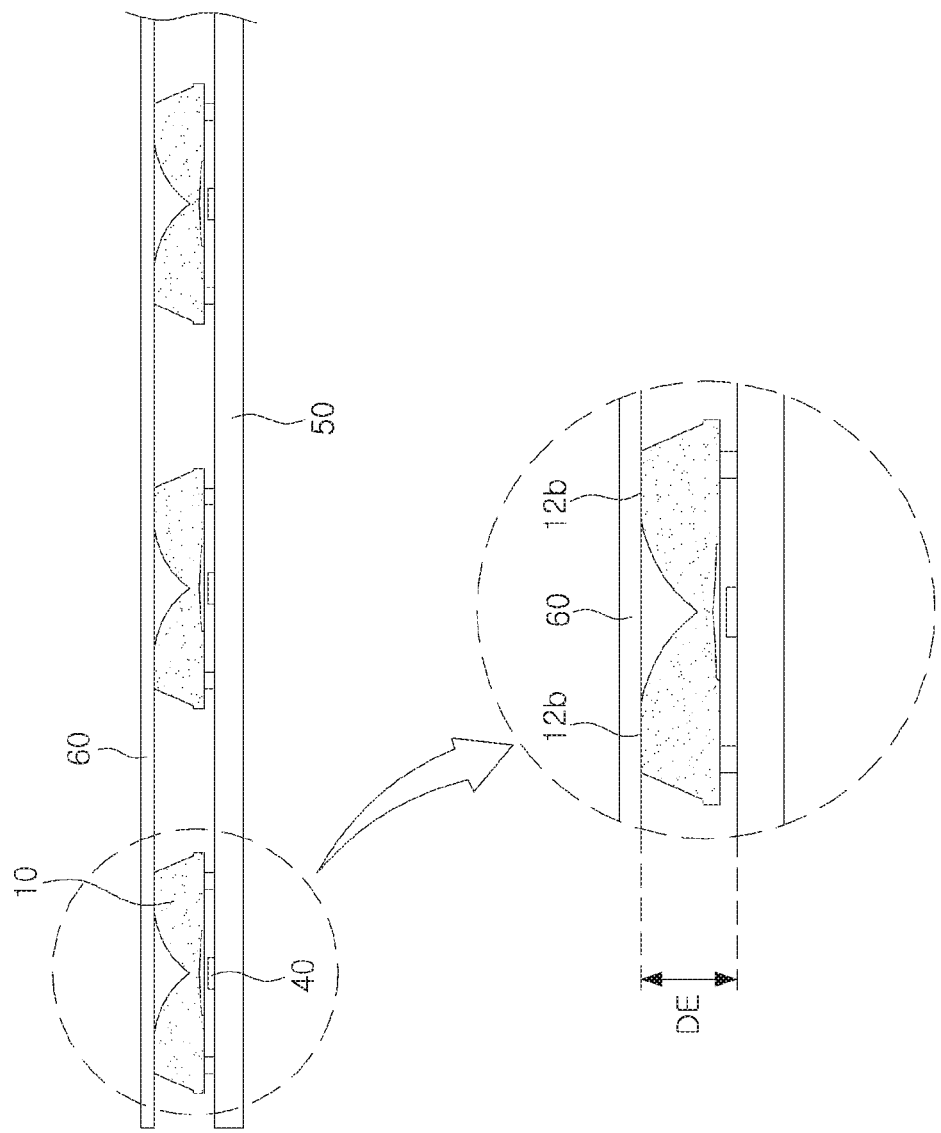

OPTICAL DEVICE AND LIGHT SOURCE MODULE INCLUDING THE SAME

CROSS-REFERENCE TO RELATED APPLICATION

This application claims priority from Korean Patent Application No. 10-2017-0155022 filed on Nov. 20, 2017 with the Korean Intellectual Property Office, the disclosure of which is incorporated herein by reference in its entirety.

BACKGROUND

1. Field

Methods and apparatuses consistent with example embodiments relate to an optical device and a light source module including the same.

2. Related Art

Wide angle lenses of light emitting device packages, employed as back light modules of display devices or lighting devices, are used to diffuse light, using refraction, from a central portion to a relatively wide lateral region. Such light is irradiated forward through upper diffusion plates. However, depending on the shape of lenses employed in the packages, light incident on diffusion plates may not be uniformly diffused, and the luminance distribution may be increased in a central region. As such, in the case that light may not be uniformly irradiated onto diffusion plates due to a nonuniform distribution of diffused light, defects in optical uniformity, such as mura, may occur in lighting devices or display devices.

Further, as the range of application of lighting devices or display devices is increased, a scheme for the configuration of further thinned backlight modules has been required.

SUMMARY

Methods and apparatuses consistent with example embodiments relate to an optical device and an optical source module having improved luminance distribution uniformity and a further reduced thickness.

According to an aspect of an example embodiment, there is provided an optical device including: a first surface, the first surface defining a concave light incident surface facing a central axis and a light source; a second surface disposed opposite the first surface, the second surface being configured to reflect light which is incident on the concave light incident surface; and a light exit surface defined between the first surface and the second surface, and having an inclined slope. The second surface includes a first reflective portion having a concave surface curving toward the first surface, and a second reflective portion having a substantially flat region, the second reflective portion is interposed between a first reflective portion edge of the first reflective portion and an outer second surface edge of the second surface. The first reflective portion is configured to totally reflect light incident at a predetermined angle or more, and the predetermined angle is within a range of 20 degrees to 40 degrees, with respect to a top surface of the light source once to the light exit surface.

According to an aspect of another example embodiment, there is provided an optical device including: a first surface facing a light source, the first surface defining a concave recess portion in a central portion of the first surface; a second surface disposed opposite the first surface, the second surface being configured to reflect light which is incident on the concave recess portion; and a side surface connecting the first surface and the second surface to each other. The second surface includes a first reflective portion having a concave surface curving toward the first surface, and a second reflective portion having a substantially flat region, the second reflective portion being interposed between a first reflective portion edge of the first reflective portion and an outer second surface edge of the second surface. The first reflective portion is configured to totally reflect light which is incident at a predetermined angle or more once to the side surface, and the predetermined angle is within a range of 20 degrees to 40 degrees, with respect to a top surface of the light source.

According to an aspect of yet another example embodiment, there is provided a light source module including: a substrate; at least one light source mounted on the substrate; and at least one optical device disposed on the at least one light source, the at least one optical device including a first surface defining a light incident surface, on which light of the at least one light source is incident, a second surface disposed opposite the first surface, the second surface being configured to reflect the light which is incident on the light incident surface to change an optical path, and a light exit surface defined by a side surface between the first surface and the second surface. The second surface includes a first reflective portion having a concave surface curving toward the first surface and a second reflective portion having a substantially flat region, the second reflective portion being interposed between a first reflective portion edge of the first reflective portion and an outer second surface edge of the second surface. The first reflective portion is configured to totally reflect light incident at a predetermined angle or more once to the light exit surface, the predetermined angle being within a range of 20 degrees to 40 degrees with respect to a top surface of the at least one light source.

BRIEF DESCRIPTION OF DRAWINGS

The above and other aspects, features, and advantages will be more clearly understood from the following detailed description, taken in conjunction with the accompanying drawings, in which:

FIG. 13 is a side cross-sectional view of the lighting apparatus of FIG. 12.

DETAILED DESCRIPTION

Hereinafter, aspects of example embodiments will be described in detail with reference to the accompanying drawings.

Figure 1:
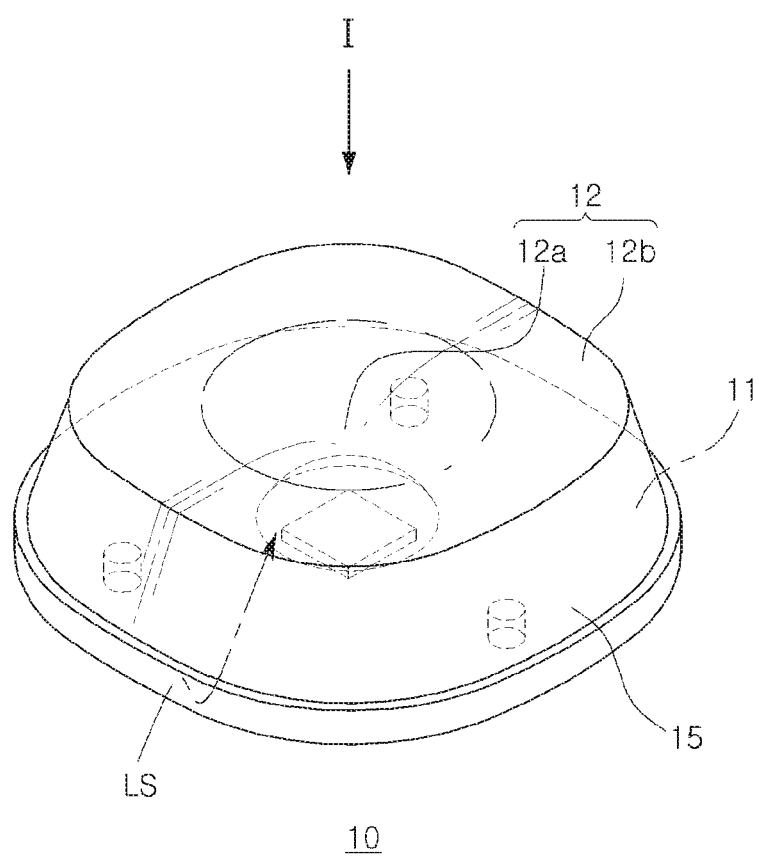
FIG. 1 is a schematic perspective view of an optical device according to an example embodiment.
Figure 2:
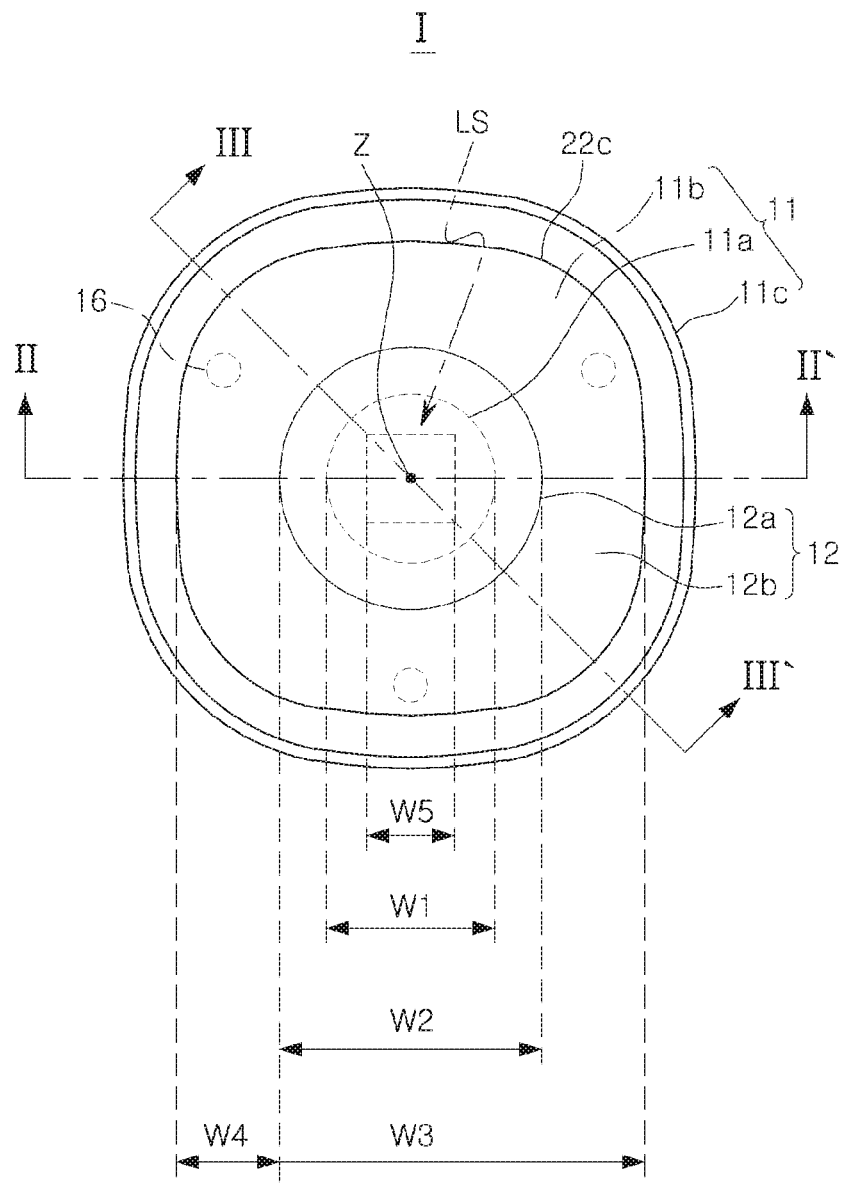
FIG. 2 is a plan view of FIG. 1, as viewed in direction 'I' in FIG. 1.
Figure 3:
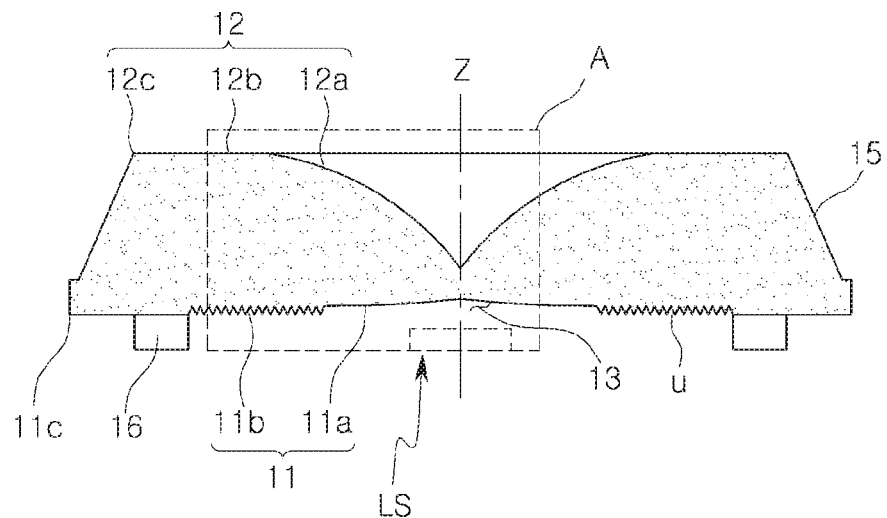
FIG. 3 is a side cross-sectional view taken along line II-II' of FIG. 2.
Figure 4:
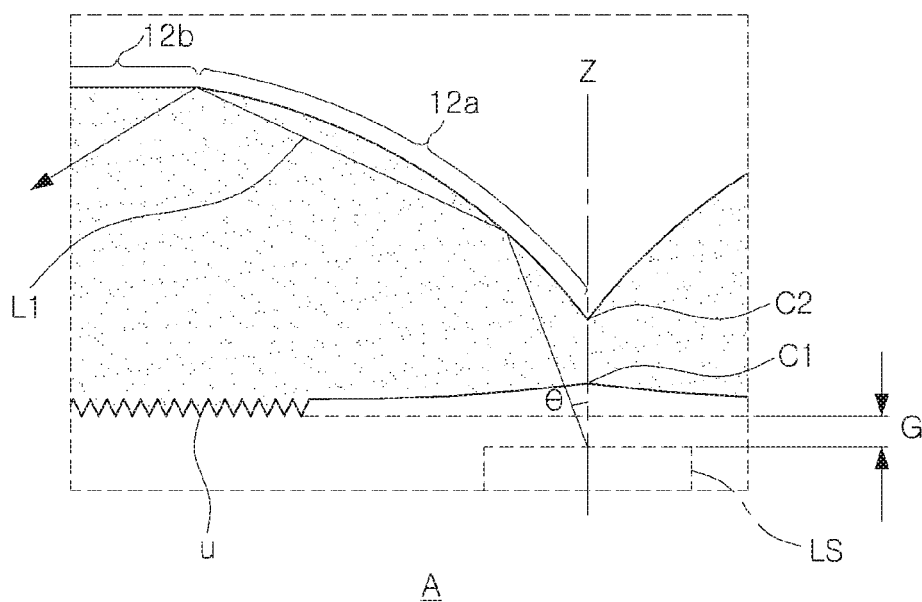
FIG. 4 is an enlarged view of portion 'A' of FIG. 3.
Figure 5A:
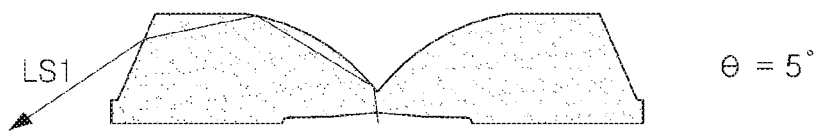
FIGS. 5A to 5E are drawings of light paths, based on angles of incidence of light with respect to line II-II' of FIG. 2.
Figure 5B:
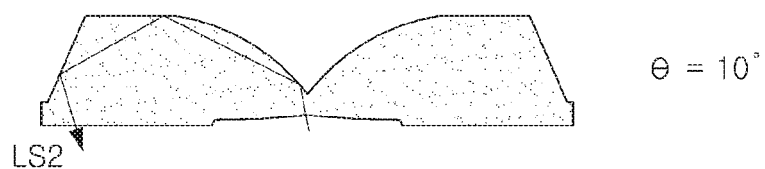
Figure 5C:
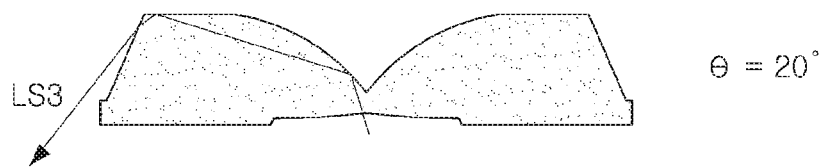
Figure 5D:
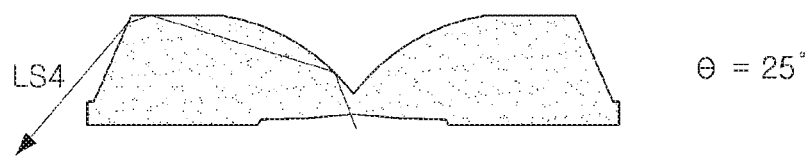
Figure 5E:
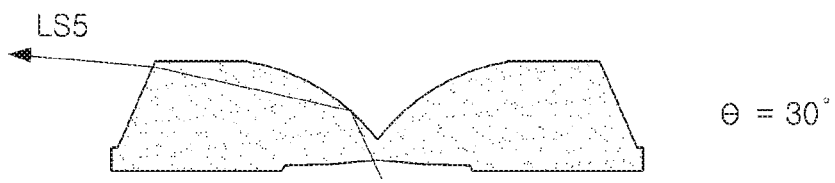
Figure 6A:
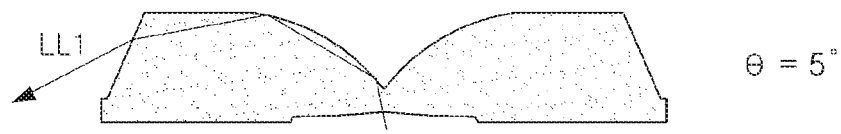
FIGS. 6A to 6E are drawings of light paths, based on angles of incidence of light with respect to line of FIG. 2.
Figure 6B:
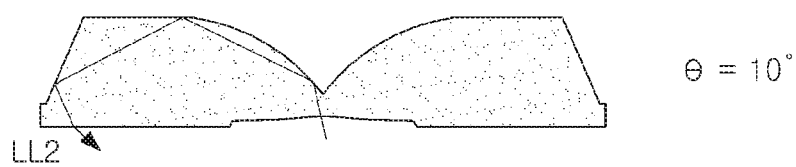
Figure 6C:
Figure 6D:
Figure 6E:
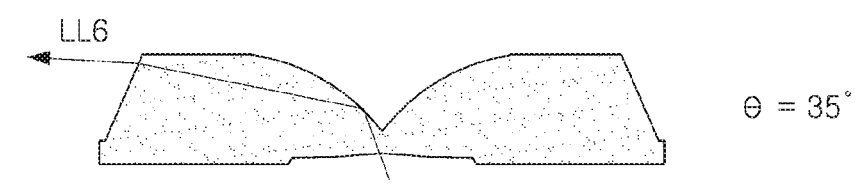

With reference to FIGS. 1 to 4, an optical device according to an example embodiment will be described. FIG. 1 is a schematic perspective view of an optical device according to an example embodiment, and FIG. 2 is a plan view of the optical device as viewed in direction 'I' of FIG. 1. FIG. 3 is a side cross-sectional view taken along line II-II' of FIG. 2, and FIG. 4 is an enlarged view of portion 'A' of FIG. 3.

Referring to FIGS. 1 and 2, an optical device 10 according to an example embodiment may be disposed on a light source LS to adjust directivity of light emitted from the light source LS. The light source LS may include, for example, a light emitting device package. The optical device 10 may include a wide angle lens diffusing light of the light source LS to implement a wide degree of light directivity.

As illustrated in FIG. 3, an optical device 10 according to an example embodiment may include a first surface 11 having a light incident surface 11a opposing the light source LS, a second surface 12 disposed on an opposite side to the first surface 11, and a light exit surface 15 defined by a side surface between the first surface 11 and the second surface 12.

The first surface 11 may correspond to a bottom surface of the optical device 10. The first surface 11 may be substantially flat, and an edge 11c thereof may be convex while having a continuous curved shape, and may have a shape rotationally symmetrical at every 90 degrees, with respect to a central axis Z. For example, as illustrated in FIG. 2, the first surface 11 may have a substantially circular shape as viewed from above, for example, in the 'I' direction, while having a shape having a relatively large diameter at every 90 degrees with respect to the central axis Z.

The first surface 11 may be disposed on the light source LS opposite the light source LS, and may have the light incident surface 11a, on which light of the light source LS is incident.

With reference to FIG. 3, the first surface 11 may include a recess portion 13 disposed in a central portion, through which the central axis Z passes, to be depressed toward the second surface 12, and a flat portion 11b extending from an edge of the recess portion 13 to an edge 11c of the first surface 11 and having a substantially flat plane. A concave-convex pattern u or an irregular reflection surface by an erosion treatment may be formed on the flat portion 11b, to smoothly diffuse light of the optical device 10 externally.

The recess portion 13 may have a structure being rotationally symmetrical with respect to the central axis Z, passing through a center of the optical device 10, and a surface of the recess portion 13 may define the light incident surface 11a, on which light of the light source LS is incident. The light generated by the light source LS may pass through the recess portion 13 to be provided to an inside of the optical device 10.

The recess portion 13 may be open externally, through the first surface 11. Referring to FIG. 4, the first surface 11 may be disposed opposite the light source LS, while being spaced apart therefrom by a predetermined gap G, but example embodiments are not limited thereto. In example embodiments, the light source LS may be disposed in the recess portion 13 such that the light source LS may be projected into the recess portion 13, and the recess portion 13 may also be disposed without the predetermined gap G from the light source LS.

As illustrated in FIG. 4, the light incident surface 11a, corresponding to a surface of the recess portion 13, may have a free-curved surface recessed toward the second surface 12, and may have a center C1 having a pointed center through which a central axis Z passes from the first surface 11.

The light incident surface 11a may have a structure rotationally symmetrical with respect to the central axis Z. The light incident surface 11a may have a structure in which inclination change degrees of both curved surfaces are symmetrical to each other, with respect to the central axis Z therebetween, are not continuous at the center C1, but the structure thereof is not limited thereto. The light incident surface 11a may have a structure in which the inclination change degrees of both curved surfaces are symmetrical to each other, with respect to the central axis Z therebetween, are continuous at a vertex, for example, the center C1.

With reference to FIG. 2, an edge of the light incident surface 11a may have a circular shape, having a diameter W1, may be formed to be greater than a width W5 of the light source LS. Thus, the light source LS may be disposed in the light incident surface 11a as viewed from above.

The first surface 11 may have a support 16 protruding toward, when viewed from above, the light source LS, and the support 16 may be disposed on the flat portion 11b.

The support 16 may fix and support the optical device 10, for example, when the optical device 10 is mounted on a substrate. For example, the optical device 10 may be mounted on the substrate via the support 16.

The support 16 may be integrated with the optical device 10, or may be attached to the first surface 11 through an adhesive or the like. A plurality of supports 16 may be arranged to surround the recess portion 13 along a circumference of the recess portion 13. In FIG. 2, three supports 16 are illustrated, but this is an example and the number of the supports 16 is not limited thereto. The number of the supports 16 may be variously changed as required. The support 16 may be formed of the same material as the optical device 10. In addition, according to an example embodiment, the support 16 may have a step shape protruding along an edge of the first surface 11.

The second surface 12 may be disposed opposite the first surface 11, and may reflect light incident through the light incident surface 11a to change an optical path. The second surface 12 may correspond to an upper surface of the optical device 10.

The second surface 12 may include a first reflective portion 12a having a curved surface concave toward the first surface 11, based on the central axis Z, and a second reflective portion 12b having a substantially flat surface while extending from an edge of the first reflective portion 12a to an edge 12c of the second surface 12. Thus, the optical device 10 may have a structure in which the second reflective portion 12b of the second surface 12 is disposed on an uppermost portion of the optical device.

Referring to FIGS. 2 to 4, the first reflective portion 12a may be disposed in a central region of the second surface 12, and may have a shape of an aspherical lens with a concave curved surface, of which a center C2 coincides with the central axis Z. The concave curved surface may be formed as a free-curved surface, totally reflecting only light incident at a predetermined angle or more, by the first reflective portion 12a, once, and then emitting the light to the light exit surface 15. For example, the first reflective portion 12a may be configured in such a manner that the light, having been totally reflected by the first reflective portion 12a once, may be emitted to the light exit surface 15 provided on a side thereof, without being totally re-reflected inside the optical device 10. An edge of the first reflective portion 12a may have a circular shape, and a diameter W2 of the circular shape of the first reflective portion 12a may be greater than the diameter W1 of the edge of the light incident surface 11a. The center C2 of the first reflective portion 12a and the center C1 of the light incident surface 11a may be disposed on the central axis Z, so that the light incident surface 11a may be viewed to be projected into the first reflective portion 12a when viewed from above.

The shape of the first reflective portion 12a may be formed as a free-curved surface, such that light incident at an angle less than a predetermined angle may be totally reflected by the first reflective portion 12a once, and then may be totally reflected by the second reflective portion 12b once. As the predetermined angle, an incident angle $\theta$ may be determined as a specific angle within a range of 20 degrees to 40 degrees with respect to the central axis Z.

Thus, for example, when the incident angle $\theta$ of light is less than the predetermined angle, the light may be totally reflected twice on an upper portion of the second surface 12, and a portion of the light may be externally emitted through the light exit surface 15, and another portion of the light may be emitted in a direction of the first surface 11, which is illustrated as optical path L1 of FIG. 4.

On the other hand, when the incident angle $\theta$ of light is equal to or higher than a predetermined angle, the light may be totally reflected by the first reflective portion 12a of the second surface 12 once, and then, may immediately be externally emitted through the light exit surface 15.

Thus, when the incident angle $\theta$ of light is less than a predetermined angle, for example, when the light is incident at an angle close to the central axis Z, the light may be totally reflected twice on the upper portion of the second surface 12, before being directed toward the light exit surface 15, and when the incident angle $\theta$ of light is equal to or higher than a predetermined angle, for example, when the light is incident at an angle far from the central axis Z, the total internal reflection of light may be significantly reduced, and may be directed to the light exit surface 15.

If the predetermined angle is less than 20 degrees, light may be incident to be relatively close to the central axis Z, and a relatively large number of total reflection may be performed to correct a path of light. Thus, light loss may be increased in the optical device 10, and external light extraction efficiency may be reduced.

If the predetermined angle exceeds 40 degrees, most of light emitted by the light source LS may be incident at a predetermined angle or more, such that most of light may be totally reflected on an upper portion of the second surface 12 once. Thus, the reflected light may be more likely to be directed toward the first surface 11, rather than be toward the light exit surface 15 provided on a side. The light emitted to the light exit surface 15 may be reduced, thereby reducing the external light extraction efficiency.

The range of the predetermined angle may be increased or decreased, depending on a shape of a cross section of the optical device 10. For example, a range of a predetermined angle taken along line III-III' may be greater in a range of about 10 degrees or less, than a range of a predetermined angle taken along line II-II' of FIG. 2.

This will be described in detail with reference to FIGS. 5A to 6E. FIGS. 5A to 5E illustrate paths of light, based on angles of incidence of the light, with respect to line II-II' of FIG. 2, and FIGS. 6A to 6E illustrate paths of light, based on angles of incidence of the light, with respect to line III-III' of FIG. 2.

A cross section, taken along line II-II', has a predetermined angle of 28 degrees, in which an angle of incidence of light is 28 degrees or less. As illustrated in FIGS. 5A to 5D, respective light beams LS1, LS2, LS3 and LS4, which have an angle of incidence less than 28 degrees, are totally reflected twice from an upper portion of the optical device. On the other hand, in FIG. 5E an incident angle of light is 30 degrees which is more than 28 degrees, and light LS5 is totally reflected on an upper portion of the optical device once, and then, is emitted to a side wall of the optical device.

A cross section, taken along line III-III', has a predetermined angle of the cross section is 32 degrees, 4 degrees wider than the predetermined angle of the cross section, taken along line II-II'. For example, in FIGS. 6A to 6D, in which an incident angle of light is 32 degrees or less, it can be seen that respective light LL1, LL2, LL3 and LL5, which have an angle of incidence less than 32 degrees, are totally reflected twice from an upper portion of the optical device. On the other hand, in FIG. 6E in which the incident angle of light is 35 degrees, more than 32 degrees, and light LL6 is totally reflected on an upper portion of the optical device once, and is then emitted to a side wall of the optical device.

The second reflective portion 12b may be formed to have a substantially flat plane by extending from an edge of the first reflective portion 12a to the edge 12c of the second surface 12. Thus, as described below, the second reflective portion 12b may be used to support a sheet-shaped diffusion plate on an upper portion thereof. The second reflective portion 12b may have a plane parallel to the flat portion 11b, and have a uniform thickness when the optical device 10 is viewed from side.

The second reflective portion 12b may have a substantially circular shape similar to the shape of the first surface 11, having a relatively large diameter at every 90 degrees with respect to the central axis Z. Thus, overall shapes of the first surface 11 and the second surface 12 may be arranged to have similar shapes with different sizes.

The light exit surface 15 may be a side surface between the first surface 11 and the second surface 12, and may have a slope inclined downwardly, toward the first surface 11. Thus, as illustrated in FIG. 3, a cross section of the light exit surface 15 may have a linear shape, inclined from the second surface 12 to the first surface 11, and thus, a probability that light emitted by the light source LS is emitted externally, without being totally reflected to an inside of the optical device 10, may be increased. Thus, external light extraction efficiency of light emitted to the light exit surface 15 may be improved.

The optical device 10 having such a configuration may increase an amount of light emitted to the light exit surface 15 on a side surface, and for example, when an optical module is constructed, a diffusion plate disposed on an upper portion thereof may be directly disposed on the upper surface without any additional structure. Thus, a distance between the light source LS and the diffusion plate may be significantly reduced, and the amount of light emitted through the diffusion plate may also be increased.

Figure 7:
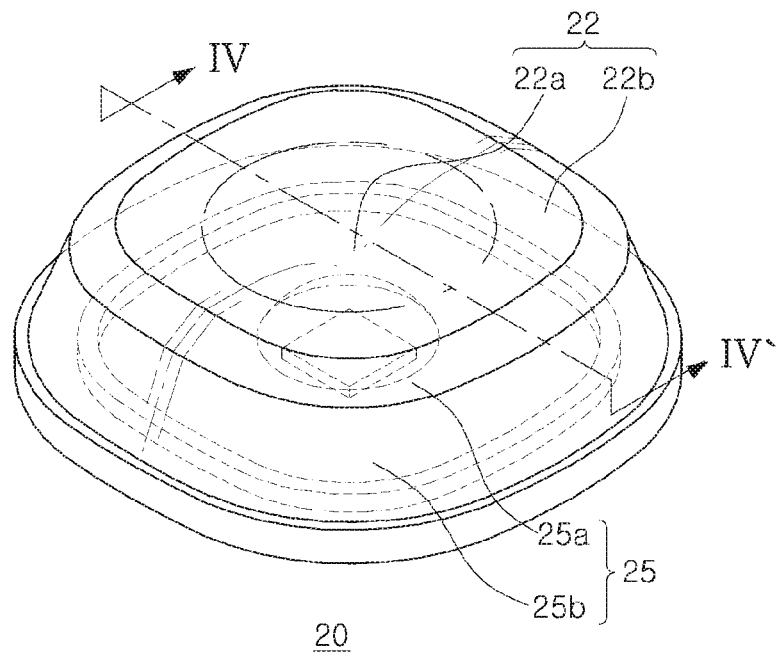
FIG. 7 is a schematic perspective view of an optical device according to an example embodiment.
Figure 8:
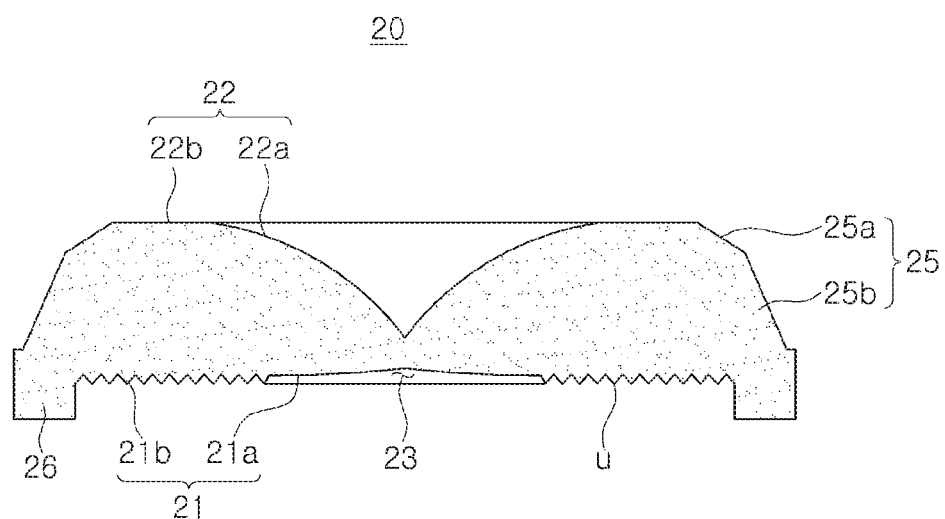
FIG. 8 is a side cross-sectional view taken along line IV-IV' of FIG. 7.

An optical device according to another example embodiment will be described with reference to FIGS. 7 and 8. FIGS. 7 and 8 are a schematic perspective view and a cross-sectional view of an optical device according to another example embodiment.

The optical device according ay be substantially the same as that of the foregoing example embodiment, and may be different therefrom only in terms of a structure of a light exit surface.

As illustrated in FIGS. 7 and 8, a light exit surface 25 may include a first region 25a having a gradient of a first inclination, and a second region 25b having a gradient of a second inclination. The first inclination of the first region 25a may to be less than the second inclination with respect to a second reflective portion 22b. The first region 25a may be in contact with the second reflective portion 22b of a second surface 22. For example, the light exit surface 25 may have two-step gradients in which the slope gradually steepens. By disposing the light exit surface 25 having such a two-step inclination, a difference in brightness distribution of light emitted from an optical device 20 may be further reduced.

Figure 9:
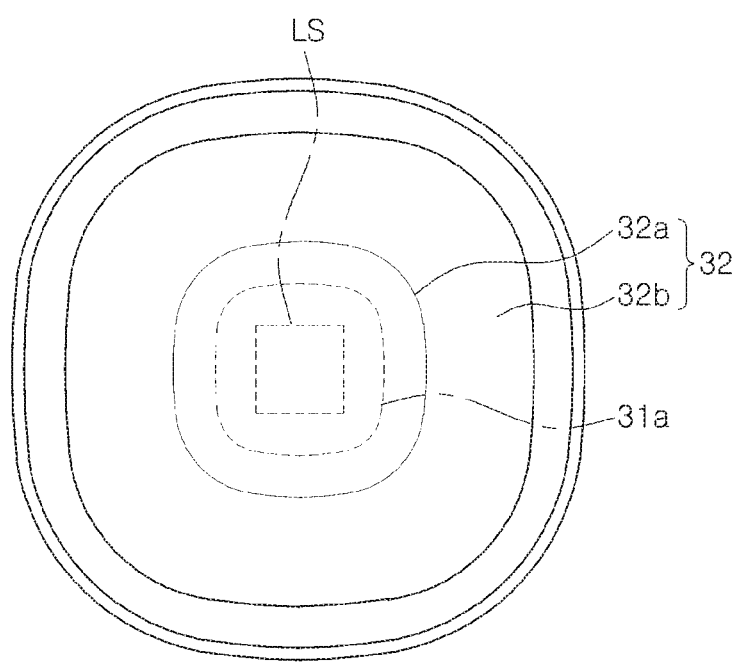
FIG. 9 is a schematic plan view of an optical device according to an example embodiment.

An optical device according to another example embodiment will be described with reference to FIG. 9. FIG. 9 is a schematic plan view of an optical device according to another example embodiment.

The optical device according to the example embodiment may be substantially the same as that of the foregoing example embodiment, and may only differ therefrom in a structural difference of a light incident surface 31a and a first reflective portion 32a.

As illustrated in FIG. 9, the light incident surface 31a and the first reflective portion 32a may be formed by a continuous curved surface with a convex edge, and may have a horizontal cross-sectional structure having a rotationally symmetrical shape at every 90 degrees, with respect to a central axis Z. For example, shapes of the light incident surface 31a and the first reflective portion 32a may be close to a quadrangle, similar to the shapes of the first and second surfaces, or may be shapes formed by a curve with respective convex sides and corners.

As such, as the shapes of the light incident surface 31a, the first reflective portion 32a and the first and second surfaces are similar to each other, a form of emitted light may be relatively close to a quadrangle, and thus, a region on which light emitted by a plurality of light sources is superimposed may be reduced.

The optical device 10 may be formed of a transparent resin material, and for example, may include polycarbonate (PC), polymethylmethacrylate (PMMA), acrylic, or the like. In addition, the optical device 10 may also be formed of a glass material, but the material thereof is not limited thereto.

The optical device 10 may include a light dispersing material within a range of approximately 3% to 15%. For example, the optical device 10 may include one or more materials selected from the group consisting of $SiO_2$, $TiO_2$ and $Al_2O_3$, as the light dispersing material. If the light-dispersing material is included in an amount of less than 3%, light may not be sufficiently dispersed, and a problem in which a light-scattering effect may not be expected may occur. If the light dispersing material is included in an amount of 15% or more, an amount of light emitted through the optical device 10 externally may be reduced, and thus light extraction efficiency may be lowered.

The optical device 10 may be formed by injecting a fluid solvent into a mold, which is then solidified. For example, injection molding, transfer molding, compression molding, or the like may be used.

Figure 12:
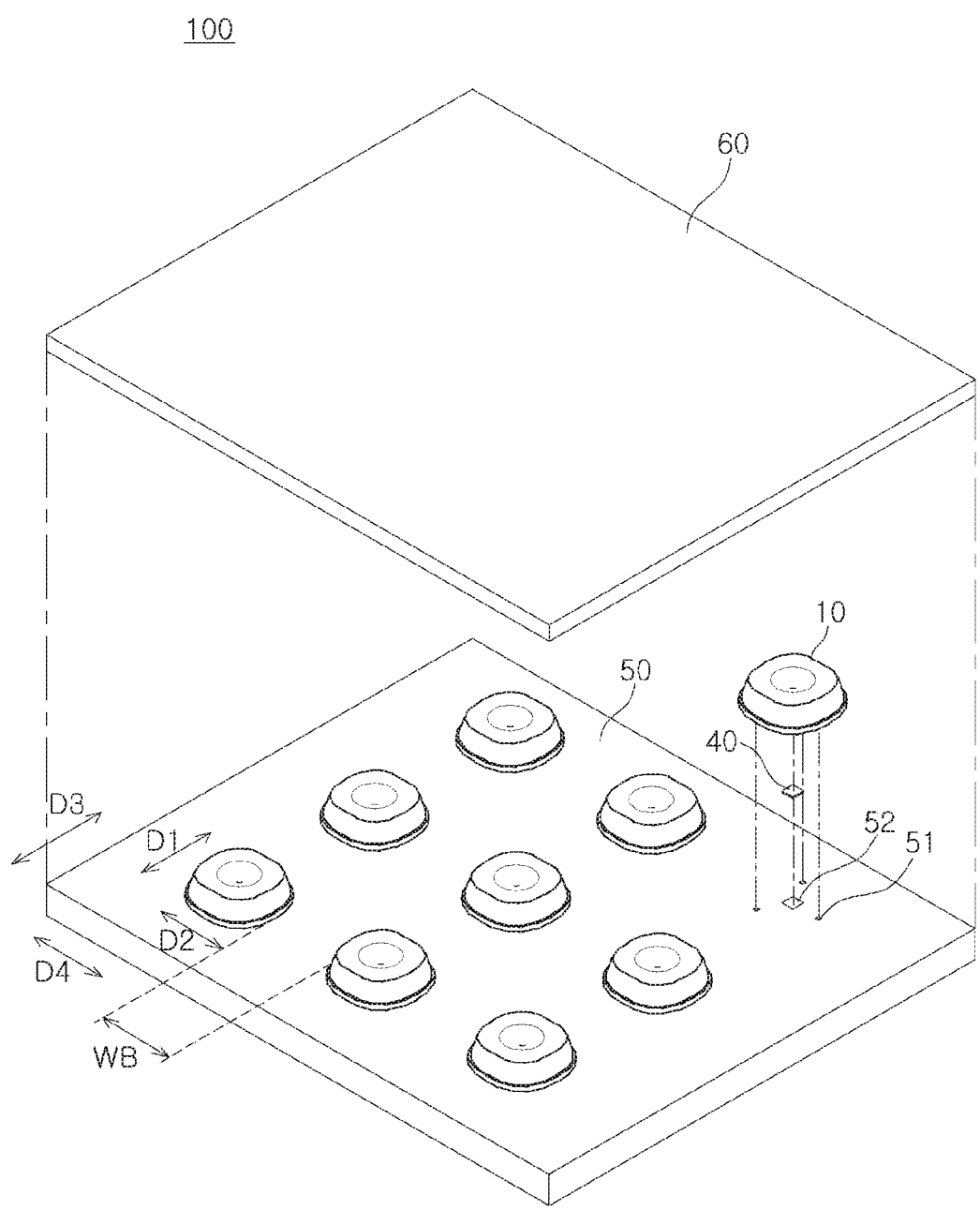
FIG. 12 is a partially exploded schematic perspective view of a lighting apparatus according to an example embodiment.

A light source module according to an example embodiment will be described with reference to FIGS. 12 and 13. FIG. 12 is a partially exploded schematic perspective view of a lighting apparatus according to an example embodiment, and FIG. 13 is a side sectional view of the lighting apparatus of FIG. 12.

Referring to FIGS. 12 and 13, a light source module 100 according to an example embodiment may include a substrate 50, a light source 40 mounted on the substrate 50, and an optical device 10 disposed on the light source 40. A diffusion plate 60 may be seated on the optical device 10. In an example embodiment, the light source module 100 may be a backlight module for a display, providing illumination for an LCD or the like.

The substrate 50 may be a printed circuit board. For example, the substrate 50 may be an FR4-type printed circuit board (PCB) or a flexible PCB capable of being easily flexed. Such a printed circuit board may be formed of an organic resin material including an epoxy, triazine, silicone, polyimide, or the like, and other organic resin materials, may be formed of a ceramic material such as silicon nitride, AlN, $Al_2O_3$, or the like, or may be formed of a metal and a metal compound such as a material of a metal core printed circuit board (MCPCB), a metal copper clad laminate (MCCL), or the like.

The substrate 50 may have a quadrangular-shaped structure, by way of example, but the shape thereof is not limited thereto. The substrate 50 may have various shapes so as to correspond to a structure of a product to be mounted. For example, the substrate 50 may have a circular structure.

Referring to FIG. 12, the substrate 50 may have a fiducial mark 51 and a light source mounting region 52. The fiducial mark 51 and the light source mounting region 52 may guide positions in which the optical device 10 and the light source 40 are to be mounted, respectively. As the fiducial mark 51, a plurality of fiducial marks may be arranged along a periphery of each light source mounting region 52.

In the case of the light source 40, a plurality of light sources may be mounted on the light source mounting region 52 provided on one surface of the substrate 50, respectively, may be arranged in rows and columns on the substrate 50, and may be arranged to have a predetermined interval WB between the light sources 40 adjacent to each other, but example embodiments are not limited thereto. For example, various modifications may be used, such as arranging respective light sources 40 to form a vertex of a triangle, or the like.

Figure 10:
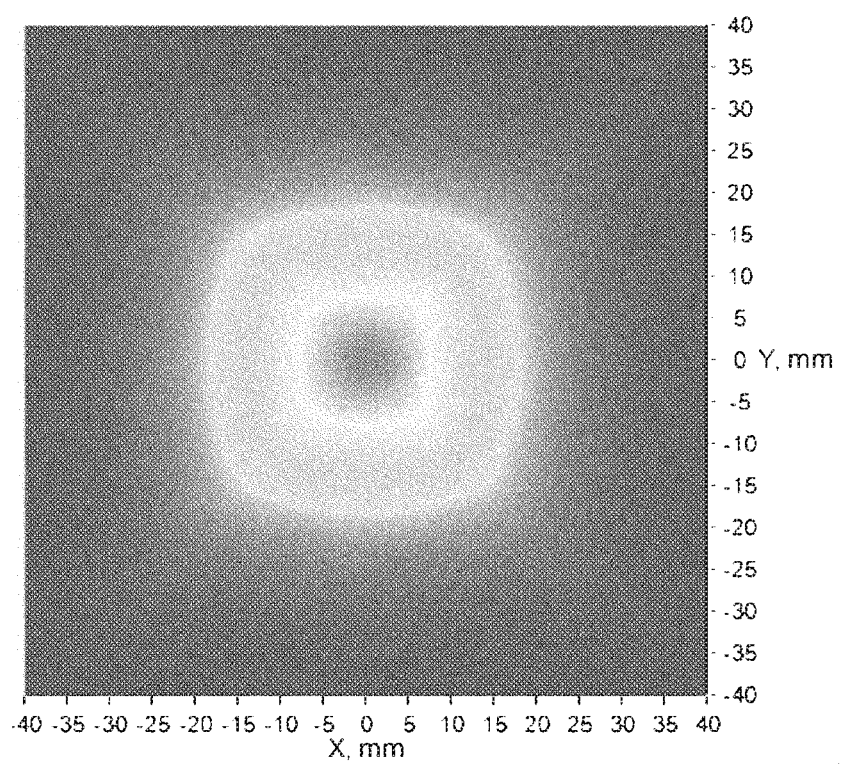
FIG. 10 is a graph of a luminance distribution on a light emission surface of a light source module according to an example embodiment.

The number of the optical devices 10 may correspond to that of the light sources 40. The optical device 10 may be mounted on the substrate 50 in a manner of covering a respective light source 40 via the fiducial mark 51 with respect to the respective light source mounting region 52. As described above, the optical device 10 may have a shape close to a quadrangle when viewed from above, but may have a curved line shape in which respective sides and corners are all convex, and the optical device 10 may be disposed in such a manner that directions D1 and D2 of the sides correspond to directions D3 and D4 of sides of the substrate 50 and the diffusion plate 60, respectively. For example, the optical device 10 may be disposed similarly to arrangement form of the substrate 50 and the diffusion plate 60, such that light emitted from the light source 40 may be uniformly irradiated onto the diffusion plate 60 in a quadrangular shape in the diffusion plate 60. FIG. 10 is a graph of luminance distribution on a light emission surface of a light source module according to an example embodiment, from which it can be appreciated that light emitted by a light source module is irradiated with a quadrangle.

The light source 40 may be an optoelectronic device, generating light of a predetermined wavelength, based on an externally applied driving power. For example, the light source 40 may include a semiconductor light emitting diode (LED) chip including an n-type semiconductor layer and a p-type semiconductor layer, and an active layer interposed therebetween, or an LED package including the same.

The light source 40 may emit blue light, green light or red light depending on a contained material or a combination thereof with a phosphor, or may or may also emit white light, ultraviolet light, or the like. The light source 40 may be comprised of the same type of light sources, generating light of the same wavelength, or may be comprised of different types of light sources, generating light of different wavelengths. In addition, the light source 40 may be variously configured, depending on a level of electric power, such as 0.5 W and 1 W.

The optical device 10 may be mounted on the substrate 50 to cover a light source 40. Further, a plurality of optical devices 10 may be respectively mounted over a plurality of light sources 40. As illustrated in FIG. 13, in the case of the optical device 10, a second reflective portion 12b on an upper surface thereof may be arranged as a flat plane, such that a sheet-type diffusion plate 60 may be stably arranged on an upper portion thereof. Thus, a separate structure for support of the diffusion plate 60 may not be required, and thus, a manufacturing process may be simplified. As the optical device 10 supports the diffusion plate 60, a thin light source module 100 having a significantly narrow interval DE between the substrate 50 and the diffusion plate 60 may be provided.

The number of the optical devices 10 may correspond to that of the number of light sources 40. The optical device 10 may be mounted on the substrate 50 in a manner of covering a respective light source 40 via the fiducial mark 51 with respect to the respective light source mounting region 52. As illustrated in FIG. 13, the second reflective portions 12b of the optical devices 10 may be arranged to be coplanar with each other, for example, when the optical device 10 is provided as a plurality of optical devices, such that the diffusion plate 60 may be stably disposed on an upper portion of the optical device without an interval therebetween. As such, an area of the second reflective portion 12b may be 1.35 times or more, larger than an area of the light source 40, to stably mount the diffuser plate 60.

In addition, the plurality of optical devices 10 may be connected to each other through a connecting portion in such a manner that the plurality of optical devices 10 may be manufactured simultaneously, without being separately manufactured.

Various types of light sources 40 may be employed in the light source module 100 according to the example embodiment. As the light source 40, a light emitting diode (LED) chip having various structures, or a light emitting diode package having the light emitting diode chip mounted therein, may be used.

Figure 11:
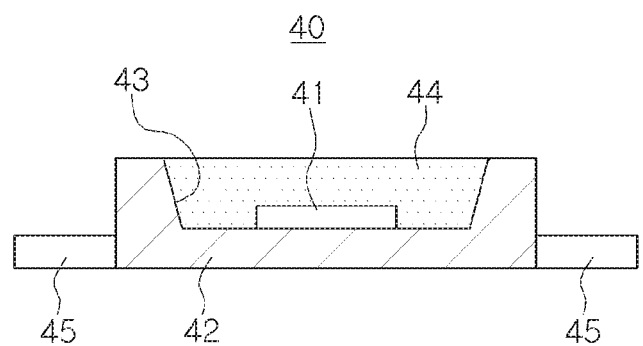
FIG. 11 is a schematic cross-sectional view of a light emitting device that may be employed in a light source module according to an example embodiment.

FIG. 11 is a schematic drawing of the light source 40. As illustrated in FIG. 11, for example, the light source 40 may have a package structure in which an LED chip 41 is mounted in a package body 42 having a reflective cup 43. The LED chip 41 may be covered by a encapsulation portion 44 including a phosphor. Although the light source 40 is illustrated within an LED package, example embodiments are not limited thereto.

The package body 42 may correspond to a base member on which the LED chip 41 is mounted and supported thereby, and may be formed of a white molding compound having relatively high light reflectivity. The use of such a white molding compound, having relatively high light reflectivity, may provide an effect of reflecting light emitted by the LED chip 41 to increase an amount of light emitted externally. Such a white molding compound may include a silicone resin-based material or a thermosetting resin-based material having high heat resistance. In addition, a white pigment and a filling material, a hardener, a releasing agent, an antioxidant, an adhesion improver, or the like may be added to a thermoplastic resin-based material. In addition, the package body 42 may also be formed of FR-4, CEM-3, an epoxy material, a ceramic material, or the like. Further, the package body 42 may be formed of a metal such as aluminum (Al).

The package body 42 may be provided with a lead frame 45 disposed thereon, for an electrical connection thereof to external power. The lead frame 45 may be formed of a material having excellent electrical conductivity, for example, a metal such as aluminum, copper, or the like. For example, when the package body 42 is formed of a metal, an insulating material may be interposed between the package body 42 and the lead frame 45.

In the case of the reflective cup 43 provided in the package body 42, the lead frame 45 may be exposed to a bottom surface of the reflective cup 43 on which the LED chip 41 is mounted. The LED chip 41 may be electrically connected to the exposed lead frame 45.

In the case of the reflective cup 43, an area of an upper portion thereof exposed to an upper part of the package body 42 may be greater than that of a bottom surface of the reflective cup 43. The area of the upper portion of the reflective cup 43 exposed to the upper part of the package body 42 may be a light emission surface of the light source 40.

The LED chip 41 may be sealed by the encapsulation portion 44 formed in the reflective cup 43 of the package body 42. The encapsulation portion 44 may include a wavelength conversion material.

According to an example embodiment, the uniformity of the luminance distribution is improved, and a thinner optical device and a light source module including the optical device may be provided.

While example embodiments have been shown and described above, it will be apparent to those skilled in the art that modifications and variations could be made without departing from the scope of the present disclosure as defined by the appended claims.

What is claimed is:

1. An optical device comprising:
   a first surface, the first surface defining a concave light incident surface facing a central axis and a light source;
   a second surface disposed opposite the first surface, the second surface being configured to reflect light which is incident on the concave light incident surface; and
   a light exit surface defined between the first surface and the second surface, and having an inclined slope that forms an acute angle with a top surface of the light source,
   wherein the second surface includes a first reflective portion having a concave surface curving toward the first surface, and a second reflective portion having a substantially flat region that is substantially parallel to the top surface of the light source, the second reflective portion being interposed between a first reflective portion edge of the first reflective portion and an outer second surface edge of the second surface, wherein the first reflective portion is configured to totally reflect light incident at a predetermined angle or more once to the light exit surface, the predetermined angle being within a range of 20 degrees to 40 degrees with respect to a plane extending along the central axis from the top surface of the light source, wherein the first reflective portion is configured to totally reflect light which is incident at less than the predetermined angle once to the second reflective portion and away from the plane extending from the top surface of the light source, wherein the second reflective portion is configured to totally reflect the light which is incident at less than the predetermined angle once to the light exit surface, and wherein the first reflective portion is interposed between the second reflective portion and the plane extending from the top surface of the light source.

2. The optical device of claim 1, wherein a first surface edge of the first surface and a second surface edge of the second surface are respectively convex, continuously curved, and rotationally symmetrical with respect to the central axis at every 90 degrees.

3. The optical device of claim 1, wherein the light exit surface comprises a first light exit region having a first inclination, and a second light exit region having a second inclination, and wherein the first inclination is less than the second inclination with respect to the second reflective portion.

4. The optical device of claim 1, wherein the first surface comprises a first surface flat portion, the first surface flat portion extending from a light incident surface edge of the concave light incident surface to a first surface edge of the first surface.

5. The optical device of claim 1, further comprising a support protruding from the first surface.

6. The optical device of claim 1, wherein the concave light incident surface comprises a light incident surface circular edge with respect to the central axis.

7. The optical device of claim 1, wherein the first surface has a relatively large diameter at every 90 degrees with respect to the central axis.

8. The optical device of claim 2, wherein the concave light incident surface and the first reflective portion edge are respectively convex, continuously curved, and rotationally symmetrical with respect to the central axis at every 90 degrees.

9. The optical device of claim 3, wherein the first light exit region is adjacent the second light exit region.

10. The optical device of claim 4, wherein the first surface flat portion is substantially parallel to the second reflective portion.

11. The optical device of claim 4, wherein the first surface flat portion is provided with a concave-convex region.

12. The optical device of claim 5, wherein the support includes a plurality of supports arranged along a periphery of the central axis.

13. The optical device of claim 5, wherein the support is a step portion protruding along an edge of the first surface.

14. The optical device of claim 6, wherein the first reflective portion comprises a first reflective portion circular edge with respect to the central axis.

15. The optical device of claim 14, wherein a first reflective portion diameter of the first reflective portion is greater than a light incident surface diameter of the concave light incident surface.

16. An optical device comprising:
a first surface facing a light source, the first surface defining a concave recess portion in a central portion of the first surface;
a second surface disposed opposite the first surface, the second surface being configured to reflect light which is incident on the concave recess portion; and
a side surface connecting the first surface and the second surface to each other, and forming an acute angle with a top surface of the light source,
wherein the second surface includes a first reflective portion having a concave surface curving toward the first surface, and a second reflective portion having a substantially flat region that is substantially parallel to the top surface of the light source, the second reflective portion being interposed between a first reflective portion edge of the first reflective portion and an outer second surface edge of the second surface,
wherein the first reflective portion is configured to totally reflect light which is incident at a predetermined angle or more once to the side surface, the predetermined angle being within a range of 20 degrees to 40 degrees with respect to a plane extending from the top surface of the light source,
wherein the first reflective portion is configured to totally reflect light which is incident at less than the predetermined angle once to the second reflective portion and away from the plane extending from the top surface of the light source,
wherein the second reflective portion is configured to totally reflect the light which is incident at less than the predetermined angle once to the side surface, and
wherein the first reflective portion is interposed between the second reflective portion and the plane extending from the top surface of the light source.

17. A light source module comprising:
a substrate;
at least one light source mounted on the substrate; and
at least one optical device disposed on the at least one light source, the at least one optical device including a first surface defining a light incident surface, on which light of the at least one light source is incident, a second surface disposed opposite the first surface, the second surface being configured to reflect the light which is incident on the light incident surface to change an optical path, and a light exit surface defined by a side surface between the first surface and the second surface that forms an acute angle with a top surface of the at least one light source,
wherein the second surface includes a first reflective portion having a concave surface curving toward the first surface, and a second reflective portion having a substantially flat region that is substantially parallel to the top surface of the at least one light source, the second reflective portion being interposed between a first reflective portion edge of the first reflective portion and an outer second surface edge of the second surface,
wherein the first reflective portion is configured to totally reflect light incident at a predetermined angle or more once to the light exit surface, the predetermined angle being within a range of 20 degrees to 40 degrees with respect to a plane extending from the top surface of the at least one light source, wherein the first reflective portion is configured to totally reflect light which is incident at less than the predetermined angle once to the second reflective portion and away from the plane extending from the top surface of the at least one light source, wherein the second reflective portion is configured to totally reflect the light which is incident at less than the predetermined angle once to the light exit surface, and wherein the first reflective portion is interposed between the second reflective portion and the plane extending from the top surface of the at least one light source.

18. The light source module of claim 17, wherein the at least one light source comprises a plurality of light sources, wherein the at least one optical device comprises a plurality of optical devices respectively disposed on the plurality of light sources, and wherein the first reflective portion of each of the plurality of optical devices are coplanar with each other.

19. The light source module of claim 17, wherein first edges of the first surface and second edges of the second surface are respectively provided as convex, continuous curved lines, and are rotationally symmetrical with respect to a central axis at every 90 degrees.

20. The light source module of claim 17, wherein a second reflective portion area the at least one optical device is at least 1.35 times larger than a light source area of the at least one light source.

* * * * *